United States Patent [19]
Merrill et al.

[11] Patent Number: 5,650,745
[45] Date of Patent: Jul. 22, 1997

[54] MOSFET IC WITH ON-CHIP PROTECTION AGAINST OXIDE DAMAGE CAUSED BY PLASMA-INDUCED ELECTRICAL CHARGES

[75] Inventors: Richard B. Merrill, Daly City; James H. Shibley, Sunnyvale, both of Calif.

[73] Assignee: National Semiconductor Corporation, Santa Clara, Calif.

[21] Appl. No.: 702,865

[22] Filed: Aug. 26, 1996

Related U.S. Application Data

[63] Continuation of Ser. No. 397,782, Mar. 3, 1995, abandoned.
[51] Int. Cl.$^6$ .......................... H03K 17/16; H03K 17/62; H01L 25/00
[52] U.S. Cl. .......................... 327/379; 327/391; 327/403; 327/404; 327/566
[58] Field of Search .......................... 327/379, 391, 327/403, 404, 564, 565, 566; 326/21, 23, 24; 257/369

[56] References Cited

U.S. PATENT DOCUMENTS

| | | | |
|---|---|---|---|
| 3,947,727 | 3/1976 | Stewart | 317/31 |
| 4,668,972 | 5/1987 | Sato et al. | 257/369 |
| 4,930,037 | 5/1990 | Woo | 361/58 |
| 5,124,579 | 6/1992 | Naghshineh | 327/379 |
| 5,333,093 | 7/1994 | Krautschneider et al. | 361/56 |
| 5,341,334 | 8/1994 | Maruyama | 327/333 |

*Primary Examiner*—David C. Nelms
*Assistant Examiner*—Trong Quang Phan
*Attorney, Agent, or Firm*—Limbach & Limbach L.L.P.

[57] ABSTRACT

An integrated circuit (IC) with metal-oxide semiconductor field effect transistor (MOSFET) circuitry and on-chip protection against oxide damage caused by plasma-induced electrical charges includes a MOSFET circuit for receiving and processing an input signal and a complementary MOSFET pass gate coupled to the input thereof for receiving and passing the input signal thereto. The complementary MOSFET pass gate includes complementary MOSFETs with control terminals, input terminals and output terminals, with the control terminals being connected for receiving the IC power supply voltage and ground potentials, the input terminals connected together for receiving the input signal and the output terminals connected together and to the input of the MOSFET circuit for passing the input signal thereto in response to the receiving of the IC power supply voltage and ground potentials. The semiconductor region forming the drains, sources and channels of the complementary MOSFETs, interposed between the metallization connections to the drain and source terminals of the complementary MOSFETs, minimizes the lengths of the metallization "antennas" and thereby minimizes gate oxide damage caused by plasma-induced electrical charges which collect on the metallization and discharge through small gate oxide areas.

26 Claims, 2 Drawing Sheets

MOSFET IC WITH ON-CHIP PROTECTION AGAINST OXIDE DAMAGE CAUSED BY PLASMA-INDUCED ELECTRICAL CHARGES

This is a continuation of application Ser. No. 08/397,782 filed on Mar. 3, 1995, now abandoned.

BACKGROUND OF THE INVENTION

1. Field of the Invention

The present invention relates to overvoltage protection for integrated circuits, and in particular, to protection against MOSFET oxide damage caused by plasma-induced electrical charges.

2. Description of the Related Art

As design and fabrication technologies have advanced for integrated circuit (ICs) with metal-oxide semiconductor field effect transistors (MOSFETs), particularly in the area of submicron analog MOSFET ICs, damage to the MOSFET gate oxide caused by plasma-induced electrical charges has become a serious problem. As is well known in the art, great care must be taken to avoid "antenna" effects by insuring that metallization which directly contacts the polysilicon gate terminals of the MOSFETs is not too long, i.e., that the surface area of such metallization is not so large that excessive electrical charges collect and discharge through small gate oxide areas.

One technique which has been used to overcome this problem is to physically break up the metallization areas and interconnect them by way of jumpers made from a subsequent layer of metallization. That way, even if the initial metallization process results in excessive charge build-up, no discharge will take place through sensitive MOSFET gate oxides. However, this technique is not completely satisfactory for a number of reasons. First, an additional layer of metallization, if not already required, becomes required to fabricate the jumpers. Also, care must be taken to ensure that any excessive charge build-up in the first layer of metallization is dissipated prior to the interconnection(s) via jumpers. Further, the introduction of additional physical interconnections in the form of the jumpers increases the potential for failures caused by bad connections.

Accordingly, it would be desirable to have an improved technique for avoiding, or at least minimizing, MOSFET gate oxide damage caused by charge collection by metallization layers during wafer processing.

SUMMARY OF THE INVENTION

In accordance with the present invention, an integrated circuit (IC) with metal-oxide semiconductor field effect transistor (MOSFET) circuitry includes on-chip protection against damage to thin gate oxides caused by plasma-induced electrical charges.

An apparatus with an IC having MOSFET circuitry and on-chip protection against oxide damage caused by plasma-induced electrical charges in accordance with one embodiment of the present invention includes a solid state switch and a circuit for receiving and processing an input signal. The solid state switch is coupled to the input of the circuit for receiving and passing the input signal thereto. The solid state switch includes two control terminals, an input terminal and an output terminal, with the two control terminals being for receiving two voltage potentials, the input terminal for receiving the input signal and the output terminal connected to the input of the circuit for passing the input signal thereto in response to the receiving of the two voltage potentials. In a preferred embodiment of the present invention, the solid state switch is a complementary MOSFET pass gate which is enabled by the IC power supply voltage and ground potentials.

These and other features and advantages of the present invention will be understood upon consideration of the following detailed description of the invention and the accompanying drawings.

DETAILED DESCRIPTION OF THE INVENTION

Figure 1:
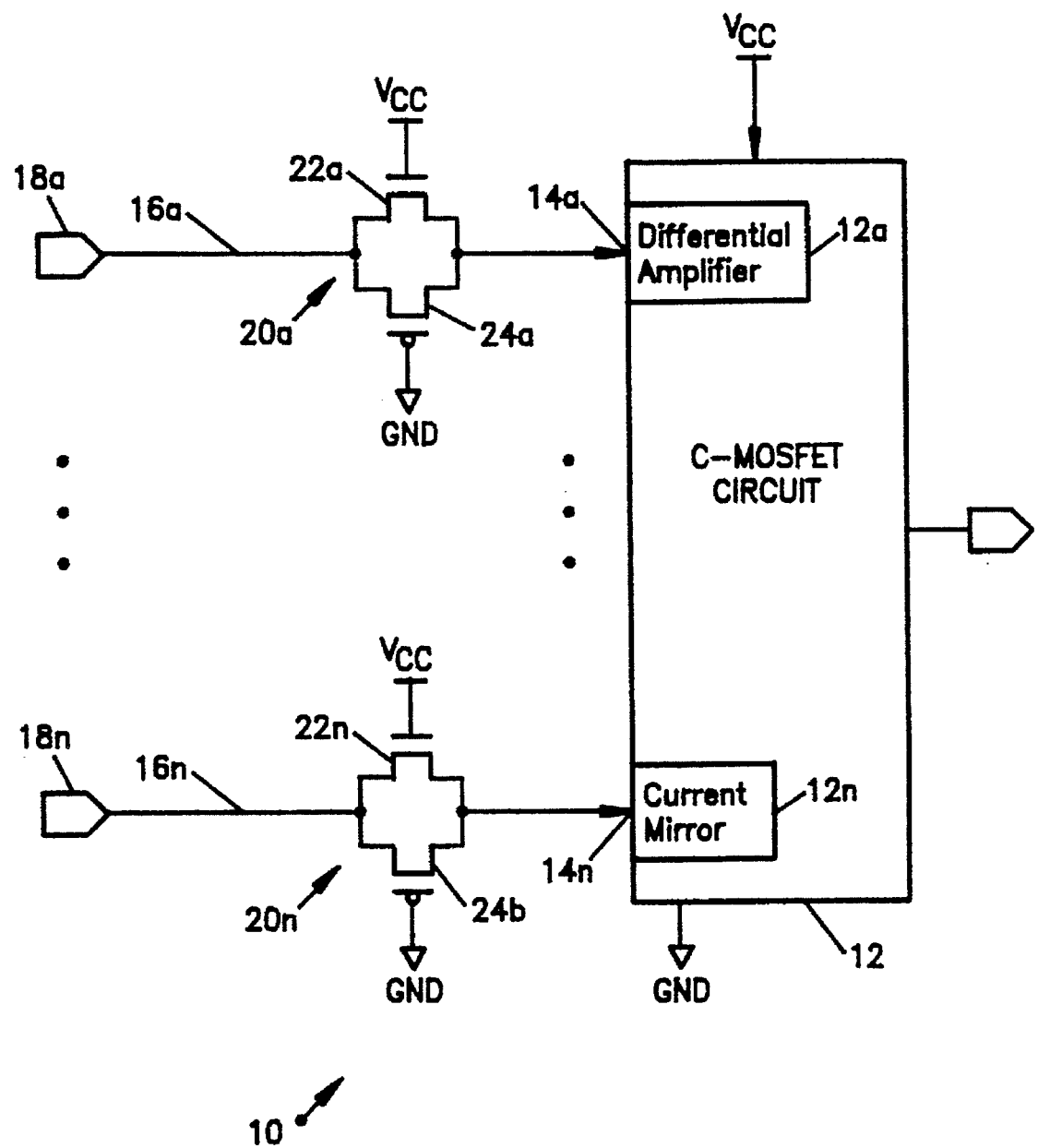
FIG. 1 illustrates in schematic and functional block diagram form an IC with MOSFET circuitry and on-chip protection against oxide damage caused by plasma-induced electrical charges, in accordance with one embodiment of the present invention.

Referring to FIG. 1, an IC 10 with MOSFET circuitry and on-chip protection against oxide damage caused by plasma-induced electrical charges, in accordance with one embodiment of the present invention, includes a complementary MOSFET (C-MOSFET) circuit 12 (e.g. differential amplifier 12a and/or current mirror 12n) having signal inputs 14 which are sensitive to plasma-induced electrical charges which may collect in the global environment, i.e., on long lines 16 of metallization which conduct input signals 18 to the circuit 12. Interposed between these long lines 16 of metallization and the sensitive MOSFET inputs 14 are C-MOSFET pass gates 20. Each pass gate 20 includes an N-MOSFET 22 and P-MOSFET 24 whose drain terminals are connected together and to the inputs 14 of the circuit 12 and whose source terminals are connected together and to the external metallization conductors 16. The gate terminal of the N-MOSFET 22 is tied to the positive IC power supply terminal VCC, while the gate terminal of the P-MOSFET 24 is connected to the negative IC power supply terminal, typically the ground terminal GND for the IC 10 when it is driven by a positive power supply voltage. Accordingly, upon the application of DC power to the IC 10, the pass gate 20 is turned on, thereby allowing the input signal 18 to reach the appropriate input 14 to the circuit 12.

Figure 2:
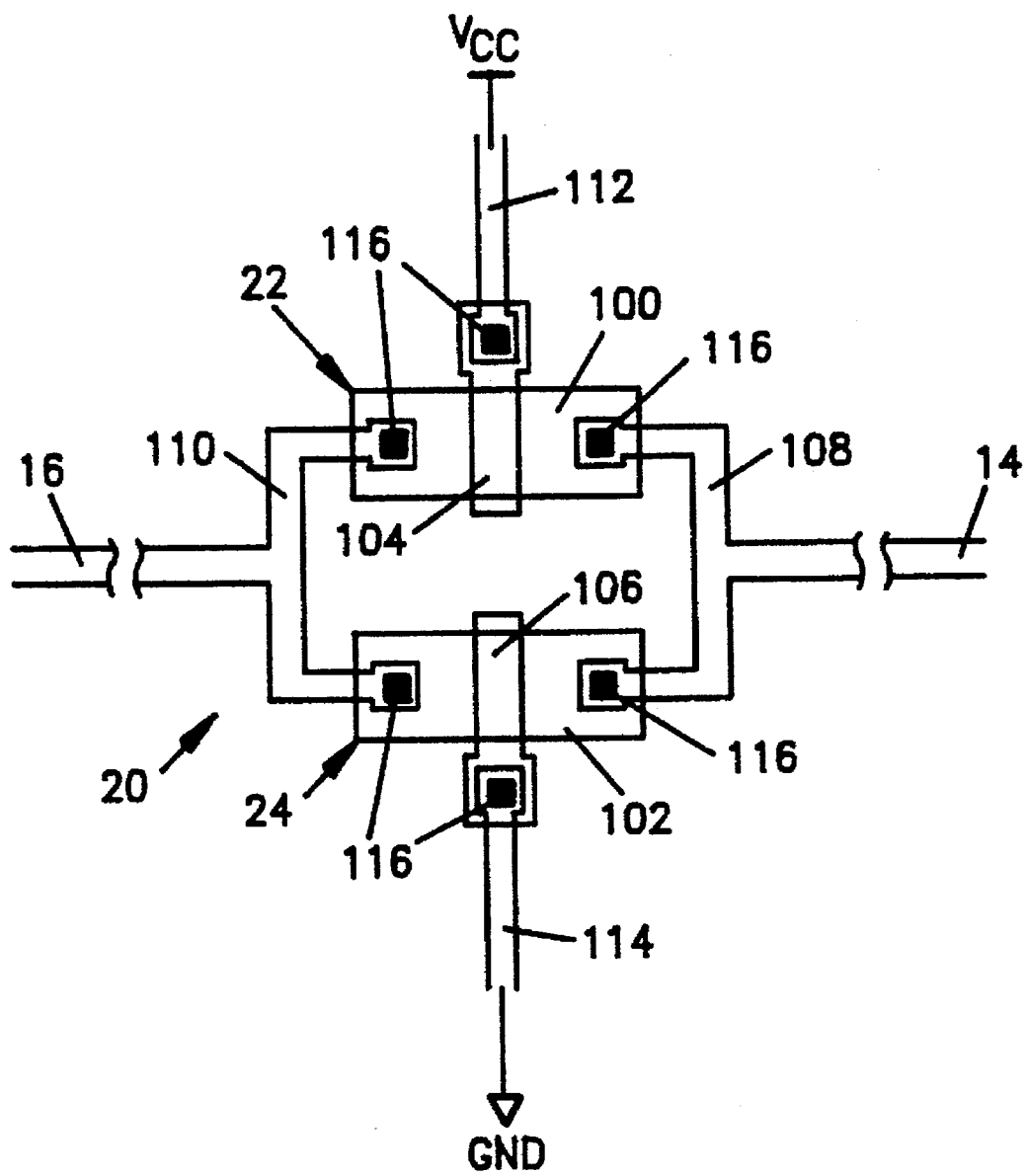
FIG. 2 is a plan view representation of one of the complementary MOSFET pass gates of FIG. 1.

Referring to FIG. 2, the transmission gate 20 of FIG. 1 can be realized as shown. In accordance with well known MOSFET design principals, the semiconductor regions 100 and 102 forming the drain source and channel elements for the N-MOSFET 22 and P-MOSFET 24, respectively, are implanted first. Next, polysilicon gate terminals 104 and 106 are deposited. Lastly, the drain, source and gate terminals are connected to metal conductors 108, 110, 112, 114 via contacts 116.

From the foregoing, it should be understood that the on-chip protection provided by the pass gates against plasma-induced oxide damage can be used advantageously in many applications. For example, every sensitive input terminal can have its own associated pass gate through which it is connected to the global environment for receiving input signals. Where little or no DC current is to be passed through such a pass gate, the pass gate can have a small width-to-length ratio (W/L) and, therefore, have no significant impact on surface area requirements. Plus, with little or no DC current passing through the pass gate, no power is dissipated. Additionally, where the MOSFET circuit of concern is one in which matched input devices are used (such as a current mirror, differential amplifier or operational amplifier) and imbalances between the input signals are of concern, using such a pass gate on each of the inputs will prevent such imbalances. For example, if the inverting input of an operational amplifier is connected to a long length of metallization (antenna) and the noninverting terminal is connected to a short length of metallization, the inherent imbalance of this situation can contribute a significant amount of threshold voltage $V_T$ offset to the input pair of MOSFETs of the operational amplifier. However, with pass gates closely connected to the input pair of MOSFETs, both MOSFETs will see only a very small pass gate and a minimal length of metallization. Hence, the input MOSFETs are protected and no artificial steps are needed to restrict the length of metallization outside in the global environment.

It should be further understood that the on-chip protection against plasma-induced oxide damage is particularly advantageous when used for protecting analog circuit inputs. Using a complete C-MOSFET pass gate instead of a single MOSFET pass transistor allows input signals to be passed with a nearly complete rail-to-rail signal range. Further, such a pass gate introduces no level shifting or voltage clamping.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated circuit (IC) with metal-oxide semiconductor field effect transistor (MOSFET) circuitry and on-chip protection against oxide damage caused by plasma-induced electrical charges, said IC comprising:

a first power supply node for operating at a first fixed power supply voltage potential;

a second power supply node for operating at a second fixed power supply voltage potential;

a circuit, coupled between said first and second power supply nodes, for receiving said first and second fixed power supply voltage potentials and including a first input for receiving and processing a first exclusive input signal; and a first solid state switch, coupled to said first input of said circuit and to said first and second power supply nodes, for receiving and passing said first exclusive input signal to said circuit, wherein said first solid state switch includes first and second control terminals, a first input terminal and a first output terminal, and wherein said first and second control terminals are connected to said first and second power supply nodes for receiving said first and second fixed power supply voltage potentials, respectively, said first input terminal is for receiving said first exclusive input signal and said first output terminal is connected to said first input of said circuit for passing said first exclusive input signal thereto in response to said receiving of said first and second fixed power supply voltage potentials.

2. An apparatus as recited in claim 1, wherein said first and second power supply nodes comprise power supply voltage and ground connections, respectively, for said IC.

3. An apparatus as recited in claim 1, wherein said first solid state switch comprises a complementary MOSFET pass gate.

4. An apparatus as recited in claim 1, wherein said circuit further includes a second input for receiving and processing a second exclusive input signal.

5. An apparatus as recited in claim 4, further comprising a second solid state switch, coupled to said second input of said circuit and to said first and second power supply nodes, for receiving and passing said second exclusive input signal to said circuit, wherein said second solid state switch includes third and fourth control terminals, a second input terminal and a second output terminal, and wherein said third and fourth control terminals are connected to said first and second power supply nodes for receiving said first and second fixed power supply voltage potentials, respectively, said second input terminal is for receiving said second exclusive input signal and said second output terminal is connected to said second input of said circuit for passing said second exclusive input signal thereto in response to said receiving of said first and second fixed power supply voltage potentials.

6. An apparatus as recited in claim 5, wherein said second solid state switch comprises a complementary MOSFET pass gate.

7. An apparatus as recited in claim 1, wherein said circuit includes matched input devices.

8. An apparatus as recited in claim 7, wherein said circuit comprises a differential amplifier.

9. An apparatus as recited in claim 7, wherein said circuit comprises a current mirror.

10. An apparatus including an integrated circuit (IC) with metal-oxide semiconductor field effect transistor (MOSFET) circuitry and on-chip protection against oxide damage caused by plasma-induced electrical charges, said IC comprising:

a first power supply node for operating at a fixed power supply voltage potential;

a second power supply node for operating at a fixed power supply ground potential;

a MOSFET circuit, coupled between said first and second power supply nodes, for receiving said first and second fixed power supply voltage potentials and including a first input for receiving and processing a first exclusive input signal; and a first complementary MOSFET pass gate, coupled to said first input of said MOSFET circuit and to said first and second power supply nodes, for receiving and passing said first exclusive input signal to said MOSFET circuit, wherein said first complementary MOSFET pass gate includes first and second MOSFETs with first and second control terminals, first and second input terminals and first and second output terminals, respectively, and wherein said first and second control terminals are connected to said first and second power supply nodes for receiving said fixed power supply voltage and ground potentials, respectively, said first and second input terminals are connected together for receiving said first exclusive input signal and said first and second output terminals are connected together and to said first input of said MOSFET circuit for passing said first exclusive input signal thereto in response to said receiving of said fixed power supply voltage and ground potentials.

11. An apparatus as recited in claim 10, wherein said MOSFET circuit further includes a second input for receiving and processing a second exclusive input signal.

12. An apparatus as recited in claim 11, wherein said IC further comprises a second complementary MOSFET pass gate, coupled to said second input of said MOSFET circuit and to said first and second power supply nodes, for receiving and passing said second exclusive input signal to said MOSFET circuit, wherein said second complementary MOSFET pass gate includes third and fourth MOSFETs with third and fourth control terminals, third and fourth input terminals and third and fourth output terminals, respectively, and wherein said third and fourth control terminals are connected to said first and second power supply nodes for receiving said fixed power supply voltage and ground potentials, respectively, said third and fourth input terminals are connected together for receiving said second exclusive input signal and said third and fourth output terminals are connected together and to said second input of said MOSFET circuit for passing said second exclusive input signal thereto in response to said receiving of said fixed power supply voltage and ground potentials.

13. An apparatus as recited in claim 10, wherein said MOSFET circuit includes matched input devices.

14. An apparatus as recited in claim 13, wherein said MOSFET circuit comprises a MOSFET differential amplifier.

15. An apparatus as recited in claim 13, wherein said MOSFET circuit comprises a MOSFET current mirror.

16. An apparatus including an integrated circuit (IC) with metal-oxide semiconductor field effect transistor (MOSFET) circuitry and on-chip protection against oxide damage caused by plasma-induced electrical charges, said IC comprising:

a first metal conductor for receiving and conducting a first exclusive input signal;

a first semiconductor region, coupled to said first metal conductor, for receiving a first plurality of fixed control signals and in response thereto receiving therefrom and conducting said first exclusive input signal;

a second metal conductor, coupled to said first semiconductor region, for receiving therefrom and conducting said first exclusive input signal; and a circuit, coupled to said second metal conductor, for receiving therefrom and processing said first exclusive input signal.

17. An apparatus as recited in claim 16, wherein said first and second metal conductors together are a portion of a metallization layer within said IC.

18. An apparatus as recited in claim 16, wherein said first semiconductor region comprises a solid state switch.

19. An apparatus as recited in claim 18, wherein said solid state switch comprises a complementary MOSFET pass gate and said first plurality of fixed control signals comprises a first plurality of fixed power supply voltage potentials.

20. An apparatus as recited in claim 16, further comprising:

a third metal conductor for receiving and conducting a second exclusive input signal;

a second semiconductor region, coupled to said third metal conductor, for receiving a second plurality of fixed control signals and in response thereto receiving therefrom and conducting said second exclusive input signal; and a fourth metal conductor, coupled to said second semiconductor region, for receiving therefrom and conducting said second exclusive input signal;

wherein said circuit is further coupled to said fourth metal conductor for receiving therefrom and processing said second exclusive input signal.

21. An apparatus as recited in claim 20, wherein said first, second, third and fourth metal conductors together are a portion of a metallization layer within said IC.

22. An apparatus as recited in claim 20, wherein said first and second semiconductor regions comprise first and second solid state switches, respectively.

23. An apparatus as recited in claim 22, wherein said first and second solid state switches comprise first and second complementary MOSFET pass gates, respectively, and said first and second pluralities of fixed control signals comprise first and second pluralities of fixed power supply voltage potentials.

24. An apparatus as recited in claim 16, wherein said circuit includes matched input devices.

25. An apparatus as recited in claim 24, wherein said circuit comprises a differential amplifier.

26. An apparatus as recited in claim 24, wherein said circuit comprises a current mirror.

* * * * *